(12) United States Patent
Fleming

(10) Patent No.: US 7,046,411 B1
(45) Date of Patent: May 16, 2006

(54) TENSILE-STRESSED MICROELECTROMECHANICAL APPARATUS AND MICROMIRRORS FORMED THEREFROM

(75) Inventor: James G. Fleming, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 11/118,573

(22) Filed: Apr. 29, 2005

(51) Int. Cl.
*H01H 51/22* (2006.01)
*G02B 26/08* (2006.01)

(52) U.S. Cl. .......................... 359/224; 335/78
(58) Field of Classification Search ................. 359/223, 359/224; 310/306, 309; 257/415; 335/78–86; 200/181
See application file for complete search history.

(56) References Cited

U.S. PATENT DOCUMENTS

| | | | |
|---|---|---|---|
| 6,023,121 A | 2/2000 | Dhuler et al. | |
| 6,300,665 B1 | 10/2001 | Peeters et al. | |
| 6,368,414 B1 | 4/2002 | Johnson | |
| 6,545,385 B1 | 4/2003 | Miller et al. | |
| 6,647,164 B1 | 11/2003 | Weaver et al. | |
| 2004/0165243 A1 | 8/2004 | Helmbrecht | |

OTHER PUBLICATIONS

Weider Tang, et al, "Novel multi-user-MEMS-processes-compatible single-layer out-of-plane electrothermal actuator" Society of Photo-Optical Instrumentation Engineers, 2003, vol. 2, No. 2, pp. 91-95.

S. Habermehl, "Stress relaxation in Si-rich silicon nitride thin films," Journal of Applied Physics, vol. 83, No. 9, May 1, 1998 pp. 4672-4677.

*Primary Examiner*—Ramon M. Barrera
(74) *Attorney, Agent, or Firm*—John P. Hohimer

(57) ABSTRACT

A microelectromechanical (MEM) apparatus is disclosed which includes one or more tensile-stressed actuators that are coupled through flexures to a stage on a substrate. The tensile-stressed actuators, which can be formed from tensile-stressed tungsten or silicon nitride, initially raise the stage above the substrate without any applied electrical voltage, and can then be used to control the height or tilt angle of the stage. An electrostatic actuator can also be used in combination with each tensile-stressed actuator. The MEM apparatus has applications for forming piston micromirrors or tiltable micromirrors and independently addressable arrays of such devices.

24 Claims, 13 Drawing Sheets

Section 1 - 1

Section 1 - 1

Section 1 - 1

Section 2 - 2

TENSILE-STRESSED MICROELECTROMECHANICAL APPARATUS AND MICROMIRRORS FORMED THEREFROM

GOVERNMENT RIGHTS

This invention was made with Government support under Contract No. DE-AC04-94AL85000 awarded by the U.S. Department of Energy. The Government has certain rights in the invention.

CROSS REFERENCE TO RELATED APPLICATIONS

This application is related to an application entitled "Tensile-Stressed Microelectromechanical Apparatus and Microelectromechanical Relay Formed Therefrom" which was filed on Apr. 11, 2005.

FIELD OF THE INVENTION

The present invention relates in general to microelectromechanical (MEM) devices, and in particular to a tensile-stressed MEM apparatus which can be used as a moveable stage which can be moved up and down vertically on a substrate, or tilted. The MEM apparatus has applications for forming micromirrors and micromirror arrays.

BACKGROUND OF THE INVENTION

Micromachining is an emerging technology for batch manufacturing many different types of mechanical and electromechanical devices on a microscopic scale using technology which was originally developed for fabricating integrated circuits (ICs). Micromachining generally avoids the use of built-in stress in a completed device since this can be detrimental to device operation.

The present invention relates to a tensile-stressed MEM apparatus wherein a relatively high level of tensile stress is controlled and utilized to effect a vertical or tilting movement of a suspended stage. Particular applications of the MEM apparatus of the present invention are to form piston micromirrors which can move up and down to impart a phase delay to an incident light beam, and to form tiltable micromirrors which can be used to redirect the incident light beam at an angle.

These and other advantages of the present invention will become evident to those skilled in the art.

SUMMARY OF THE INVENTION

The present invention relates to a microelectromechanical (MEM) apparatus which comprises a substrate, a tensile-stressed actuator formed on the substrate and providing movement in a direction which is substantially parallel to the substrate, and a stage supported above the substrate by a flexure, with the flexure being operatively connected at one end thereof to the tensile-stressed actuator to raise the stage above the substrate in response to the movement provided by the tensile-stressed actuator. The tensile-stressed actuator further comprises a beam suspended above the substrate and having a longitudinally-directed tensile stress therein, with an unanchored portion of the beam being moveable substantially parallel to the substrate in response to the longitudinally-directed tensile stress therein.

The MEM apparatus can also include means for changing a position of the stage after the stage has been raised above the substrate in response to the movement provided by the tensile-stressed actuator. In certain embodiments of the present invention, the means for changing the position of the stage can comprise a voltage applied across the beam to resistively heat the beam, and thereby reduce the longitudinally-directed tensile stress therein. In other embodiments of the present invention, the means for changing the position of the stage can comprise an electrostatic actuator operatively connected to the tensile-stressed actuator to change the movement provided by the tensile-stressed actuator.

The substrate can comprise silicon. The beam in certain embodiments of the present invention can comprise tungsten; and can further comprise titanium nitride. In these embodiments, the flexure can also comprise tungsten; and can further comprise titanium nitride. In other embodiments of the present invention, each tensile-stressed beam can comprise silicon nitride, and can further comprise an electrically-conductive material such as polycrystalline silicon which has been doped for electrical conductivity.

Certain elements of the MEM apparatus including the flexure and stage can comprise a mesh structure to reduce the tensile stress therein during fabrication. The stage can comprise a metal (e.g. tungsten or aluminum) or polycrystalline silicon (also termed polysilicon), and can further include a light-reflecting surface (e.g. to form a micromirror).

The present invention also relates to a MEM apparatus which comprises a substrate; a stage suspended above the substrate by at least one flexure, with each flexure being connected between the stage and a set of tensile-stressed beams having a tensile stress which is directed longitudinally within each beam therein, and with the longitudinally-directed tensile stress generating a movement in a direction substantially parallel to the substrate to bend the flexure and thereby raise the stage above the substrate; and means, operatively connected to the stage, for changing the position of the stage above the substrate.

Each beam can comprise tungsten; and each flexure can also comprise tungsten. In some embodiments of the present invention, the set of tensile-stressed beams can comprise a single beam; whereas in other embodiments of the present invention, the set of tensile-stressed beams can comprise a plurality of beams. The stage can comprise a light-reflecting surface (e.g. to form a piston micromirror, or a tiltable micromirror).

The means for changing the position of the stage above the substrate can comprise a voltage applied to resistively heat the set of tensile-stressed beams and thereby reduce the longitudinally-directed tensile-stress therein. The means for changing the position of the stage above the substrate can alternately comprise an electrostatic actuator operatively connected to the stage. In certain embodiments of the present invention, the means for changing the position of the stage above the substrate lowers or raises the stage without tilting the stage; whereas in other embodiments of the present invention, the means for changing the position of the stage above the substrate tilts the stage.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
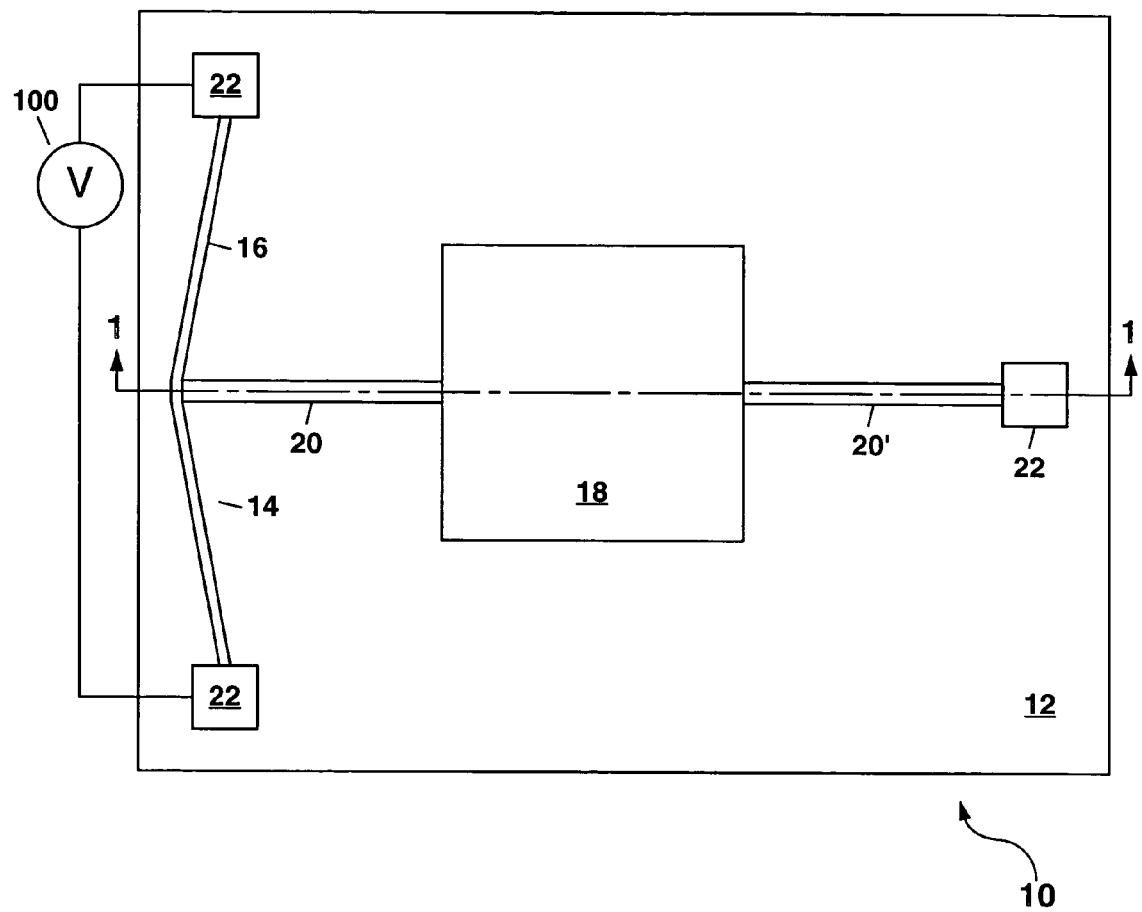
FIG. 1 shows a schematic plan view a first example of the MEM apparatus of the present invention in an as-fabricated position.

Referring to FIG. 1, there is shown schematically in plan view a first example of the MEM apparatus 10 of the present invention. The MEM apparatus 10 comprises a substrate 12 having a tensile-stressed actuator 14 formed thereon. The tensile-stressed actuator 14 comprises one or more beams 16 (also referred to herein as a set of tensile-stressed beams), with each beam 16 having a longitudinally-directed tensile stress therein. The tensile-stressed actuator 14 is operatively connected to a stage 18 by a flexure 20. An opposite side of the stage 18 is connected to the substrate 12 through another flexure 20' and an anchor 22. The tensile-stressed actuator 14 is suspended above the substrate 12 by additional anchors 22.

Figure 2A:
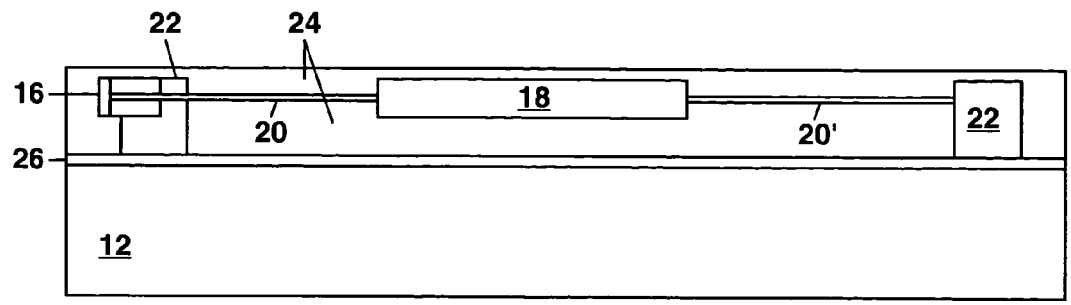
FIG. 2A shows a schematic cross-section view of the MEM device of FIG. 1 in the as-fabricated position prior to removing a sacrificial material which surrounds the various elements of the MEM device and prevents any movement therein.

The MEM apparatus 10 can be fabricated by micromachining as will be explained in detail hereinafter. Initially, the MEM apparatus 10 is formed with a sacrificial material 24 contacting the various elements of the device 10 and restraining any motion thereof. This is illustrated in FIG. 2A which shows a schematic cross-section view of the MEM apparatus 10 of FIG. 1 taken along the section line 1—1 after the device 10 has been built up during fabrication, but prior to removal of the sacrificial material 24. In FIG. 2A, the flexures 20 and 20' are substantially planar (i.e. flat) and in-line with the actuator 14 and stage 18; and the beam 16 of the tensile-stressed actuator 14 is bent away from the stage 18 in an as-fabricated position.

Figure 7:
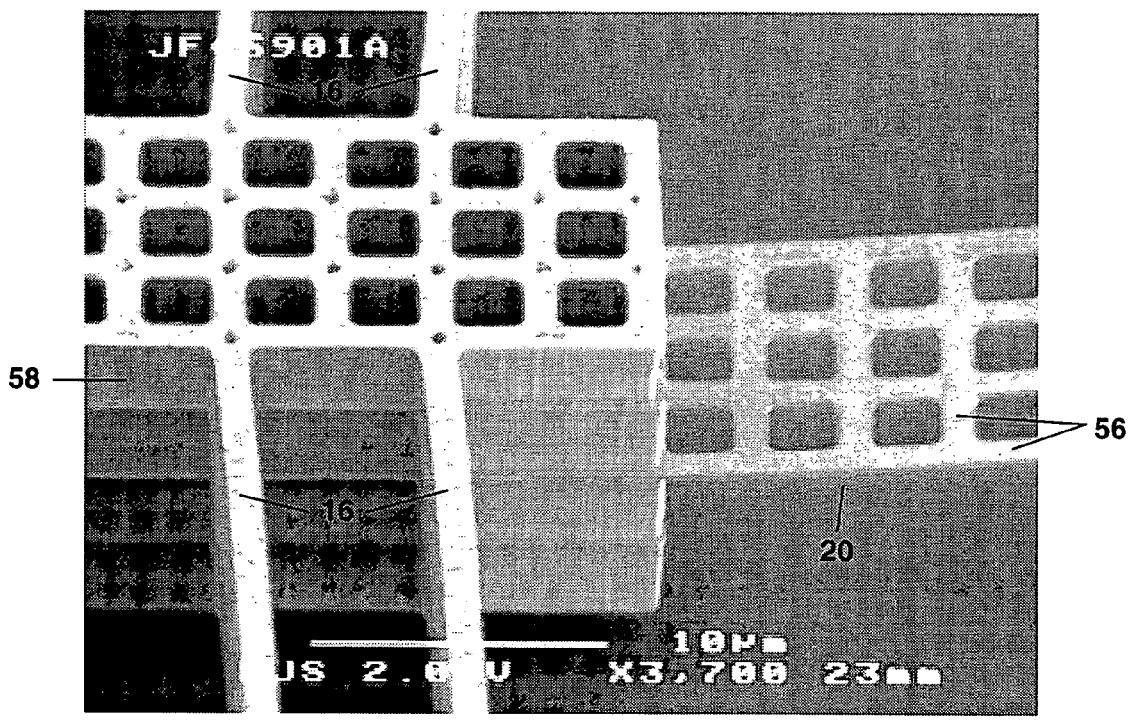
FIG. 7 shows an enlarged image of a portion of the MEM device of FIG. 6 to show a mesh structure for the flexure and a central member to which the flexure and tensile-stressed beams are attached.

The term "bent" as used herein refers to a bent shape which deviates from a straight line. The beam 16 can be formed with the bent shape, although no actual bending of the beam 16 occurs during fabrication. Such a bent beam 16 can be curvilinear (i.e. bowed) as shown in FIG. 1, or can be formed from a plurality of straight segments which are directly or indirectly connected together end to end to provide an overall shape for the beam 16 which is not straight as shown in FIGS. 3A and 7. Since the beam 16 has a relatively large longitudinally-directed tensile stress therein as a result of fabrication, an unanchored portion of the beam 16 between each end thereof will have a propensity to at least partially unbend once the sacrificial material 24 has been removed. This is shown schematically in FIG. 2B.

Figure 2B:
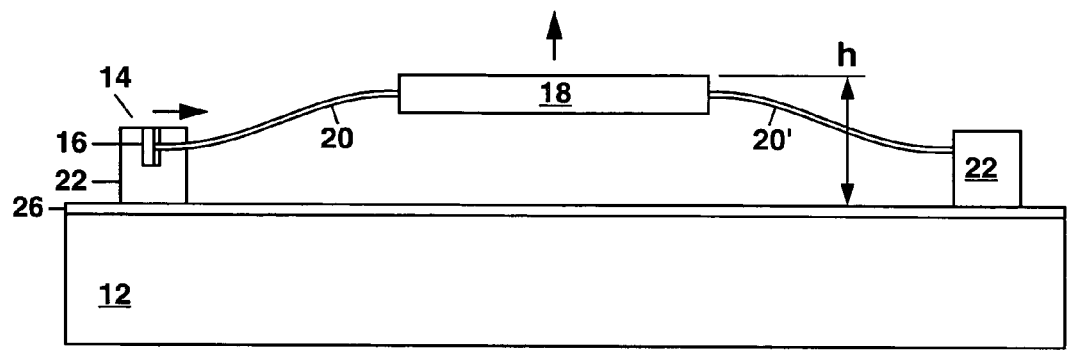
FIG. 2B shows a schematic cross-section view of the MEM device of FIG. 1 immediately after removing the sacrificial material to release the various elements of the MEM device for movement, with the stage being popped up.
Figure 3A:
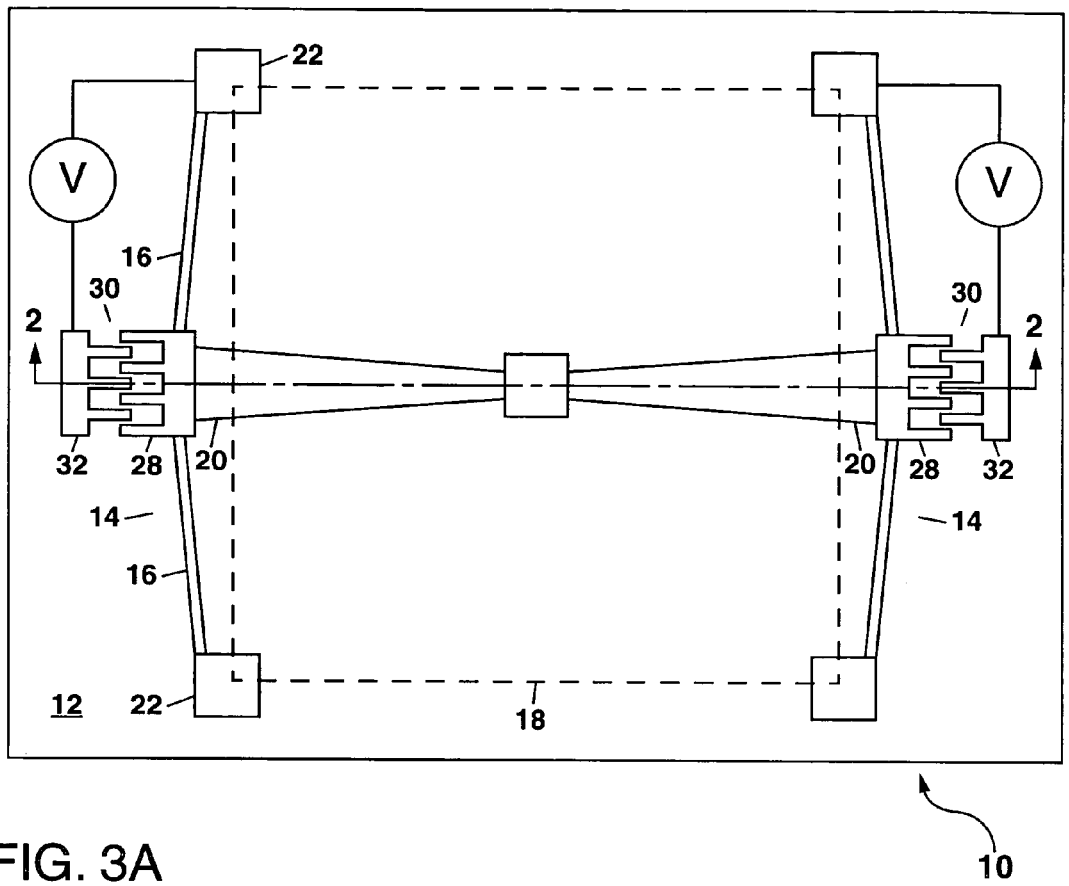
FIG. 3A shows a schematic plan view of a second example of the MEM apparatus of the present invention.

In FIG. 2B, upon removal of the sacrificial material 24, the longitudinally-directed tensile stress within the beam 16 of the actuator 14 acts to unbend the beam 16 and to provide a force and movement which is directed substantially parallel to the substrate 12 to push against an end of the flexure 20 that is connected to the beam 16. This force and movement, which is indicated by the horizontal arrow in FIG. 2B, buckles the flexures 20 and 20' upward so that the flexures 20 and 20' raise the stage 18 to an initial height, h, above the substrate 12.

Each flexure 20 and 20' can be formed with a structure that is designed to facilitate an upward bending of the end thereof which is connected to the stage 18. This can be done by tailoring the shape of the flexures 20 and 20' so that the flexures 20 and 20' are necked down near the stage 18. Alternately, a stress differential can be built into the flexures 20 and 20' to provide a propensity for each flexure 20 and 20' to curl up away from the substrate. This can be done by stacking a tensile-stressed layer (e.g. tungsten) overtop a compressively-stressed layer (e.g. titanium nitride) as will be described hereinafter.

Figure 2C:
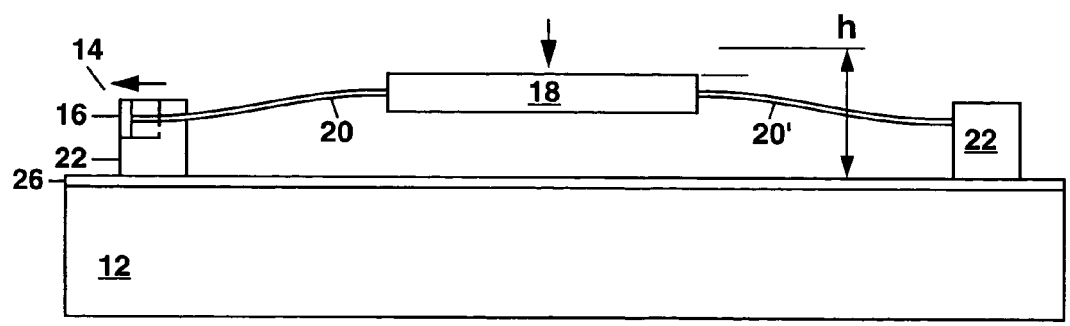
FIG. 2C shows a schematic cross-section view of the MEM device of FIGS. 1 and 2B when the beam is heated to reduce the longitudinally-directed tensile stress therein and thereby lower the height of the stage.

In FIG. 2C, once the stage 18 has been raised to the initial height, h, the stage 18 can be lowered below the initial height, h, by reducing the force provided by the tensile-stressed actuator 14 which pushes against the end of the flexure 20 connected to the actuator 14. This can be done by reducing the longitudinally-directed tensile stress in the beam 16 by heating the beam 16. This will produce a further bending of the beam 16 in the direction shown by the horizontal arrow in FIG. 2C. The exact height of the stage 18 will, in general, be inversely proportional to the temperature to which the beam 16 is heated which can be up to several hundred °C.

The beam 16 can be resistively heated to effectively decrease the longitudinally-directed tensile stress therein. This can be done by connecting a voltage across the beam 16 which can be made electrically conductive (e.g. comprising tungsten or doped polycrystalline silicon) and flowing an electrical current through the beam 16 to resistively heat the beam 16. Both ends of the beam 16 in FIG. 1 are connected to anchors 22 which can also form contact pads for making external electrical connections to a power source 100 which supplies the voltage. The anchors 22 can be electrically insulated from the substrate 12 (e.g. by an intervening insulating layer 26 of silicon nitride when the substrate comprises silicon). Since the beam 16 is suspended above the substrate 12 and thermally isolated therefrom, heating of the beam 16 can be done relatively quickly (on the order of up to a few tens of microseconds or less). The electrical input power required to heat the beam 16 can be, for example, 50–150 milliwatts, with the voltage V generally being in the range of 1–100 volts depending upon an overall resistivity of the beam 16.

In the example of FIG. 1, the beam 16 can be up to several millimeters in length and can have a width of, for example, 1–5 microns (μm) and a height which exceeds the width by, for example, 2–5 times. The flexures 20 and 20' can have lengths which are generally smaller than the length of the beam 16, with the width of the flexures 20 and 20' being, for example, 2–10 μm wide, and with a thickness of each flexure 20 and 20' generally being less than 1 μm. The stage 18 in the example of FIG. 1 can have lateral dimensions of up to several millimeters, with a thickness of the stage being about the same as the height of the beam 16 (e.g. 2–20 μm).

Operation of the tensile-stressed actuator 14 of the present invention is very different from that of a conventional MEM thermal actuator. The tensile-stressed actuator 14 described herein provides a force and movement to initially raise the stage 18 in the absence of any applied electrical power; whereas a conventional thermal actuator requires that electrical power be applied for any movement to occur. The tensile-stressed actuator 14 of the present invention generates a force which is "pulling" in nature as the bent beam 16 tries to straighten due to the longitudinally-directed tensile stress built therein. A conventional thermal actuator provides a force which is "pushing" in nature. Thus, the orientation of the tensile-stressed actuator 14 to uplift the stage 18 requires that the beam 16 be bent in a direction away from the stage 18 in order for the "pulling" force of the actuator 14 to push against the flexure 20 to raise the stage 18. This orientation of the tensile-stressed actuator 14, which is shown in FIG. 1, is exactly opposite that which would be required for use of a conventional thermal actuator which provides an oppositely-directed "pushing" force. Additionally, when electrical power is applied and increased to heat the tensile-stressed actuator 14 of the present invention, the force provided by the actuator 14 is reduced. This, too, is exactly opposite a conventional thermal actuator wherein the "pushing" force is increased with increasing electrical power and heating.

In other embodiments of the present invention, the force provided by the tensile-stressed actuator 14 can be reduced or increased by providing another actuator on the substrate 12 adjacent to the tensile-stressed actuator 14 and operatively coupled thereto. This use of another actuator in combination with the tensile-stressed actuator 14 is schematically illustrated in a second example of the MEM apparatus 10 of the present invention in FIGS. 3A and 3B.

In FIG. 3A, the tensile-stressed actuator 14 comprises a pair of beams 16 which are connected to the substrate 12 through an anchor 22 at one end of each beam 16. The other end of each beam 16 is attached to a moveable electrostatic comb 28 of an electrostatic comb actuator 30. The electrostatic comb actuator 30 also includes a stationary electrostatic comb 32 which is supported on the substrate 12. The electrostatic combs 28 and 32 each have a plurality of comb fingers which are intermeshed. When a voltage, V, is applied between the electrostatic combs 28 and 32, an electrostatic force of attraction is generated which urges the fingers of each comb 28 and 32 to further engage thereby moving the moveable electrostatic comb 28 towards the stationary electrostatic comb 32. This electrostatic force of attraction is opposed to the force produced by the tensile-stressed actuator 14 and pulls on the flexure 20 to lower the stage 18 below its initial height in the absence of the electrostatic force of attraction. The voltage, V, used to actuate the electrostatic comb actuator 30 can be variable in a range of up to about 200 Volts.

As shown in FIG. 3A, the voltage, V, can be applied to the moveable electrostatic comb 28 through the anchor 22 and tensile-stressed beam 16. It should also be noted that the electrostatic comb actuator 30 can be used alone or in combination with electrical heating of the beams 16 in the tensile-stressed actuator 14 to control and vary the height of the stage 18.

Figure 3B:
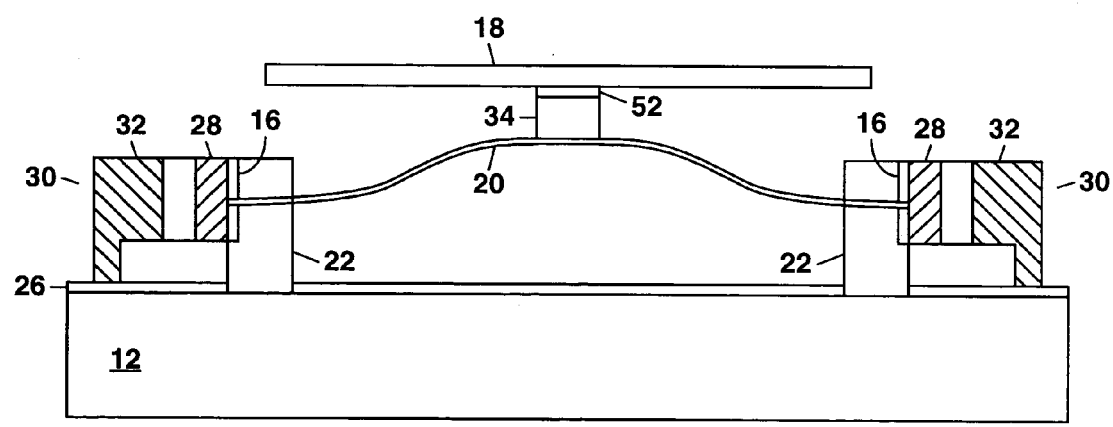
FIG. 3B shows a schematic cross-section view of the device of FIG. 3A taken along the section line 2—2 in FIG. 3A.

In the example of FIGS. 3A and 3B, a single flexure 20 can be used connected between a pair of tensile-stressed actuators 14. In this example, the stage 18 is also connected to the flexure 20 by a support post 34. This allows the stage 18 to move up and down without tilting or translation; and it also allows the stage 18 to be located above the anchors 22 and other elements of the MEM apparatus 10. This is particularly useful for forming an array 50 of MEM devices 10 wherein a plurality of stages 18 are closely packed together and overlie elements of the same or different MEM devices 10 as shown in FIG. 4.

Figure 4:
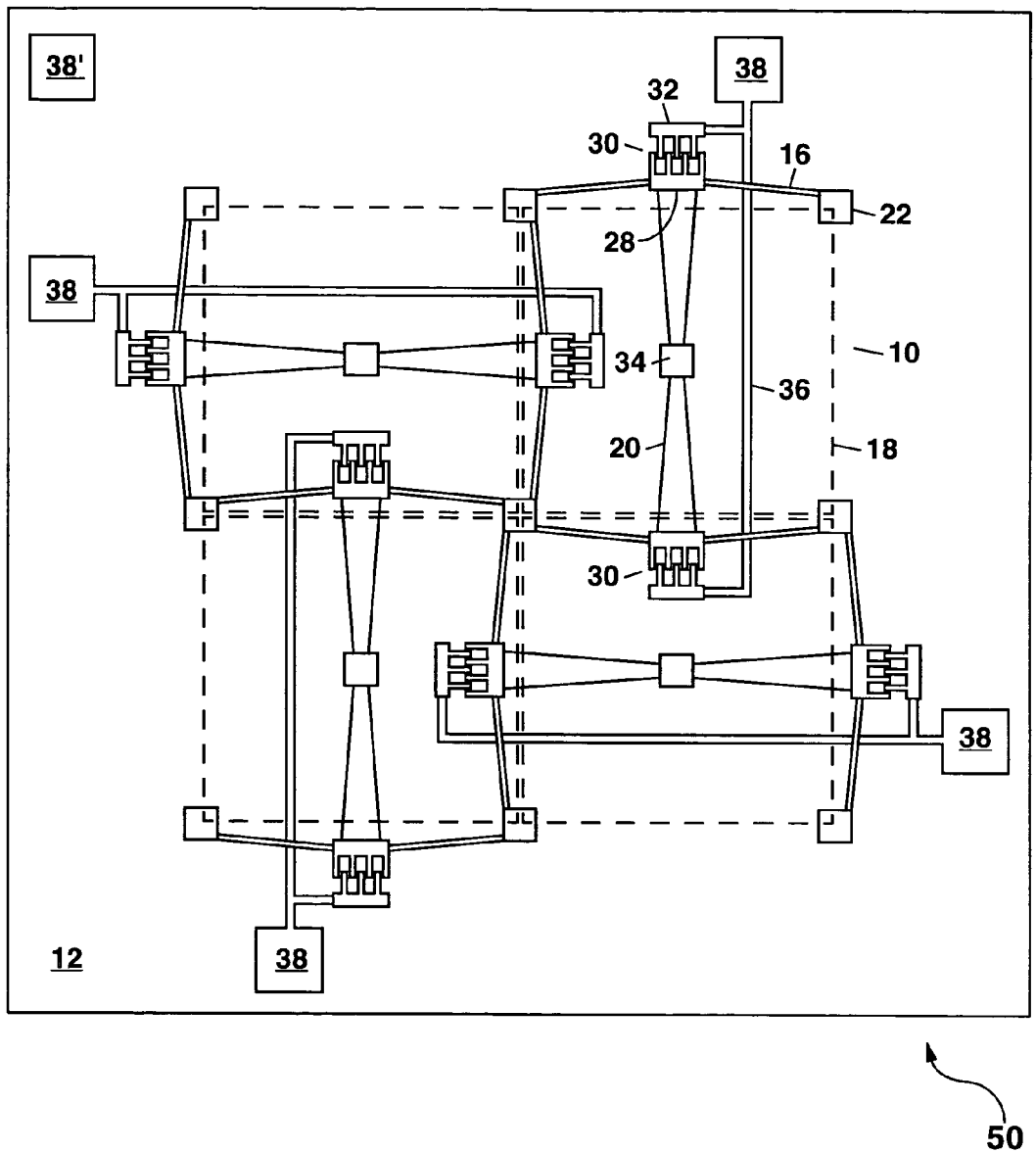
FIG. 4 shows a plurality of MEM devices according to FIG. 3A arranged as a two-dimensional array on a common substrate. The locations of the stages, which have been omitted for clarity, are indicated by the dashed boxes.

In the example of FIG. 4, a two-dimensional array of MEM devices 10 are provided with a relatively high fill factor. Those skilled in the art will understand that there are many different ways of forming a one- or two-dimensional array of MEM devices 10 based on the teachings of the present invention. Those skilled in the art will also understand that, although the schematic plan view of the example of FIG. 4 shows only a few MEM devices 10 for clarity, the number of MEM devices 10 can range up to hundreds or thousands or more depending upon a particular application for the array 50, with the MEM devices 10 in the array 50 being independently electrically addressable, or addressable in sets.

In the example of FIG. 4, each stage 18 has been omitted to show the arrangement of underlying elements and has been replaced with a dashed box which shows its location. The stationary electrostatic combs 32 of the two electrostatic actuators 30 for each MEM device 10 have been electrically connected in parallel through wiring 36 on the substrate 12, with the wiring 36 being connected to a contact pad 38. The wiring 36 can comprise a metal (e.g. tungsten or aluminum) or doped polysilicon depending upon whether tungsten or silicon nitride is used to form the tensile-stressed beams 16 and other elements of the MEM apparatus 10.

The moveable electrostatic combs 28 for all the MEM devices 10 can be connected to the substrate 12 through the beams 16 and anchors 22 to a ground contact pad 38'. In other embodiments of the present invention, row and column addressing can be used to independently address each MEM device 10 in the array 50, or to address particular sets of MEM devices 10. In the example of FIG. 4, the tensile-stressed actuators 14 are used to initially raise the stage 18 of each MEM device 10; and the electrostatic comb actuators 30 are used to control and vary the height of the stage 18 thereafter.

Each MEM device 10 in the example of FIG. 4 can be independently controlled and can be used as a piston mirror array 50 (also termed a phased array mirror) by providing a light-reflecting surface on a topside of each stage 18. The light-reflecting surface, which can comprise a surface of the stage 18 or a reflecting coating (e.g. aluminum or gold) thereon, can be used to reflect incident light with the phase of the reflected light being controlled by the height of each mirror (i.e. the stage 18). In this application, the height of the stage 18 of each MEM device 10 is preferably controllable and variable over a range of at least one-half wavelength of the incident light. Those skilled in the art will understand that, although the stages 18 in FIG. 4 are shown as square boxes, other shapes can be used for the stages 18 including polygonal, circular, elliptical, etc.

The various examples of the present invention described herein can be formed by surface micromachining using tungsten or silicon nitride as a tensile-stressed material to form the beams 16 and other elements of the MEM apparatus 10. To form the MEM device 10 using tungsten as the tensile-stressed material, the process described hereinafter with reference to FIGS. 5A–5L can be used. This process, which is referred to as a molded tungsten process (also referred to herein as a damascene process), will be illustrated with a series of schematic cross-section views taken along the section line 2—2 in FIG. 3A.

Figure 5A:
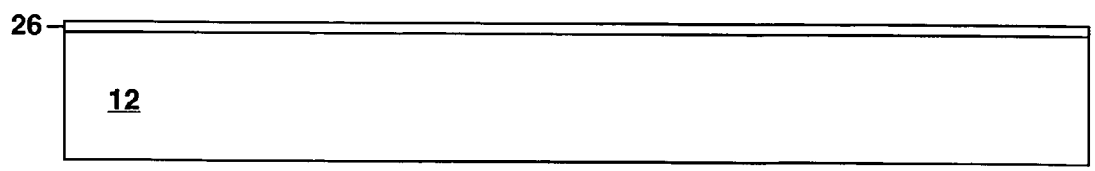
FIGS. 5A–5L schematically illustrate in cross-section view steps for fabricating the MEM device of FIGS. 3A and 3B.

In FIG. 5A, the substrate 12 can comprise silicon and can be initially prepared by forming the electrically-insulating layer 26 over top the substrate 12. The electrically-insulating layer 26 can comprise a layer of thermal oxide about 0.6 μm thick formed by a conventional wet oxidation process at an elevated temperature (e.g. 1050° C. for about 1.5 hours) with an overlying layer of low-stress silicon nitride about 0.8 μm thick which can be deposited by low-pressure chemical vapor deposition (LPCVD) at about 850° C. One or more vias (not shown) can be photolithographically defined and etched through the electrically-insulating layer 26 as needed using reactive ion etching to form electrical connections between various elements of the MEM apparatus 10 being formed and the substrate 12.

Figure 5B:
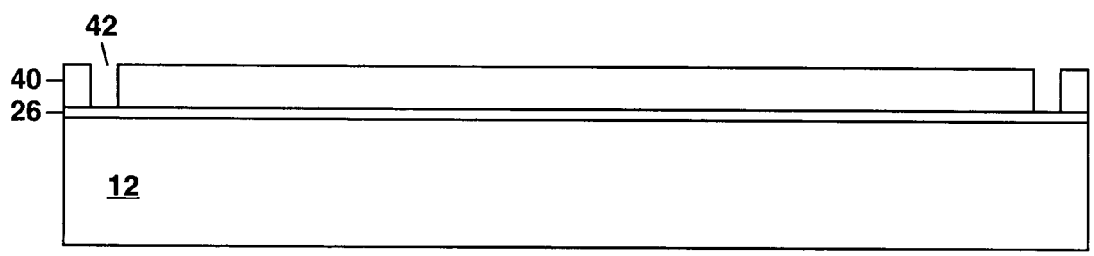

In FIG. 5B, a 2-μm thick layer of PETEOS 40 can be blanket deposited over the substrate 12. PETEOS is a silicate glass formed from the decomposition of tetraethylortho silicate, also termed TEOS, by a plasma-enhanced chemical vapor deposition (PECVD) process. A plurality of openings 42 can be etched at the locations wherein the various elements of the MEM apparatus 10 are to be built up. The openings 42 can be of arbitrary shape including trenches and intersecting trenches. A plurality of intersecting trenches can be used to form certain elements of the MEM apparatus 10 which have a mesh structure to minimize any lateral stress therein due to the use of tungsten or silicon nitride which are tensile-stressed materials (see FIGS. 7 and 8). Etching of the openings 42 can be performed using a photolithographically-defined etch mask (not shown) and reactive ion etching.

Figure 5C:
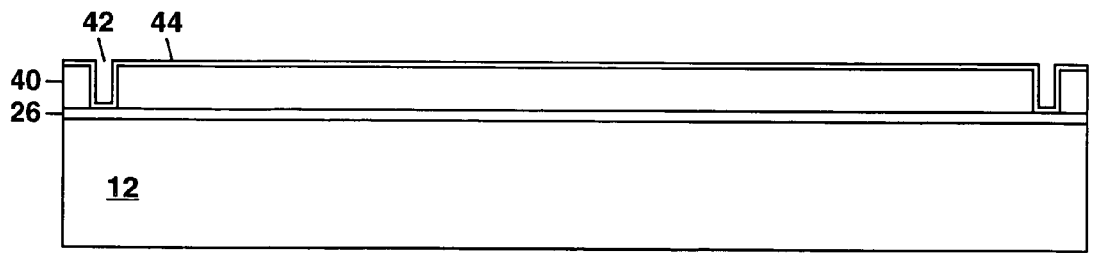

In FIG. 5C, when the structure of the MEM apparatus 10 is being formed using tungsten as the tensile-stressed material, a 20–50 nanometer thick layer of titanium nitride (TiN) 44 can be initially blanket deposited over the substrate 12 and in the openings 42 using a sputter deposition process. The titanium nitride layer 44 serves as an adhesion layer since tungsten does not stick or nucleate well on the PETEOS layer 40 which is essentially silicon dioxide. The titanium nitride layer 44 is also compressively stressed and, together with the PETEOS layer 40 which is also compressively stressed, helps to compensate for a high level of tensile stress in one or more subsequently-deposited layers of tungsten 46, thereby significantly reducing an accumulation of lateral stress which could otherwise lead to a bowing of the substrate 12 during fabrication of the MEM device 10.

Figure 5D:
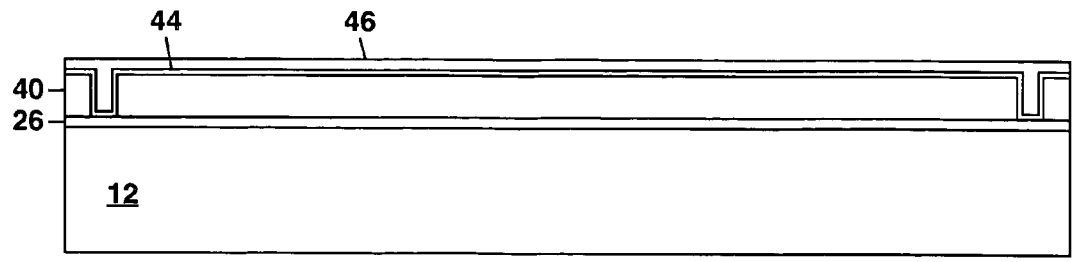

In FIG. 5D, a layer of tungsten 46 can be blanket deposited over the substrate 12 by chemical vapor deposition to fill in the openings 42. The tungsten layer 46 can be up to about 0.8 μm thick, and can be deposited at a temperature of about 400° C. In general, for deposition of the tungsten by chemical vapor deposition (CVD) at 400° C., the openings 42 are formed as trenches up to about 1.5–2 μm wide and with an aspect ratio of height to width being in a range of about 1:1 to 5:1.

After deposition of the tungsten layer 46, the tungsten 46 and titanium nitride 44 outside the openings 42 can be removed by a chemical-mechanical polishing (CMP) process step. This planarizes the substrate 12 as shown in FIG. 5E.

Figure 5E:
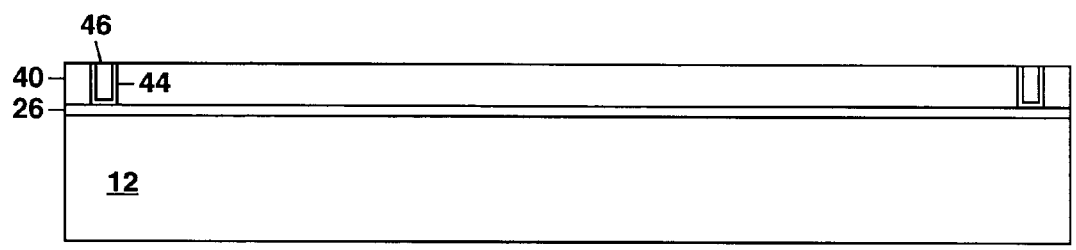
Figure 5F:
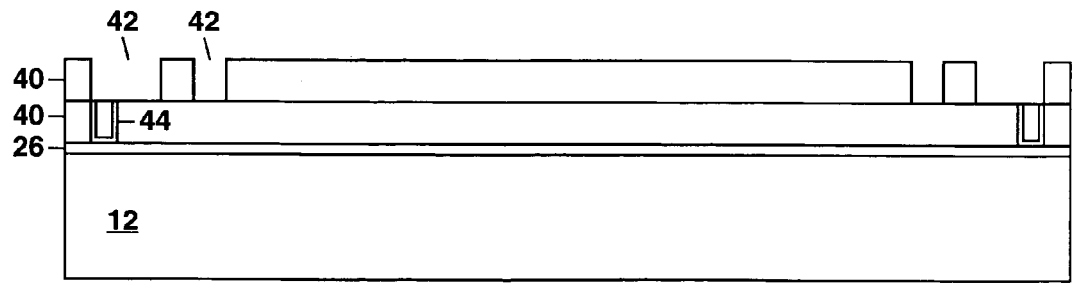

In FIG. 5F, another layer of PETEOS 40 about 2-μm thick can be blanket deposited over the substrate and patterned with a photolithographically-defined etch mask and reactive ion etching to form a plurality of openings 42 therein at locations wherein another layer of tungsten 46 is to be deposited to further build up elements of the MEM apparatus 10 as needed.

Figure 5G:
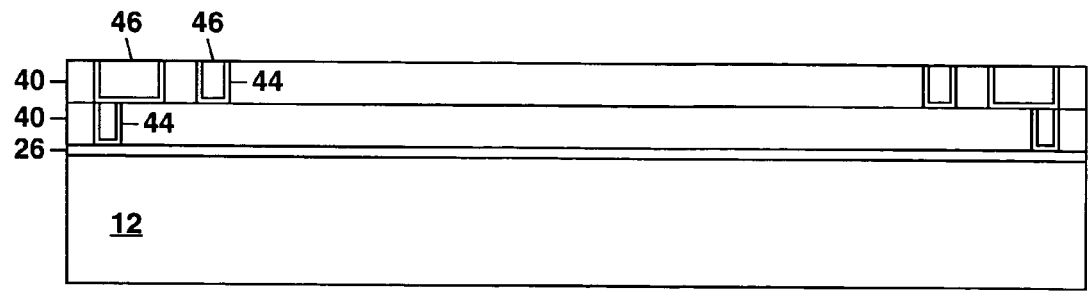

The steps in FIGS. 5C–5E can then be repeated to deposit additional layers of titanium nitride 44 and tungsten 46, and then to remove any of the titanium nitride 44 and tungsten 46 extending outside of the openings 42 as shown in FIG. 5G.

Figure 5H:
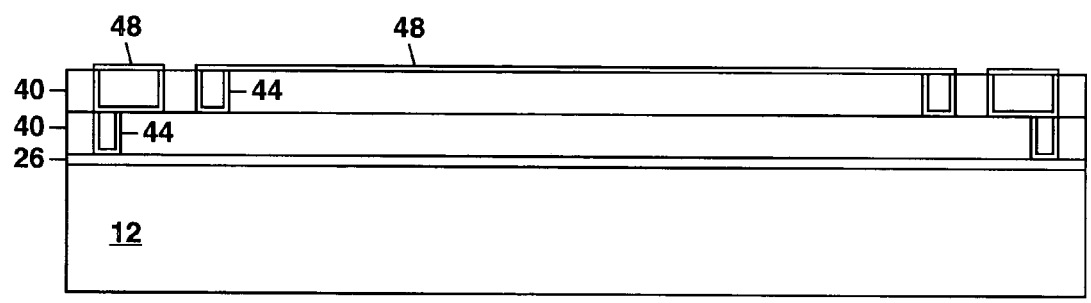

In FIG. 5H a composite layer 48 comprising, for example, 25 nanometers thickness of titanium nitride 44 and 100 nanometers thickness of tungsten 46 can be formed over the substrate 12 and patterned by reactive ion etching for use in forming the flexure 20. In the composite layer 48, the titanium nitride 44 is in compression while the tungsten 46 is in tension. This produces a propensity for the flexure 20 to bend upward instead of downward when the surrounding PETEOS 40 is later removed and each end of the flexure 20 is displaced inward by the tensile-stressed actuators 14. Thus, the structure of the flexure 20 can aid in raising the platform 18. Additionally, the shape of the flexure 20 can be tapered or stepped inward from each end of the flexure 20 to further aid in bending the flexure 20 upward instead of downward. Portions of the composite layer 48 can also be used to build up the structure of other elements of the MEM apparatus 10 including the beams 16, the moveable electrostatic combs 28 and the stationary electrostatic combs 32.

Figure 5I:
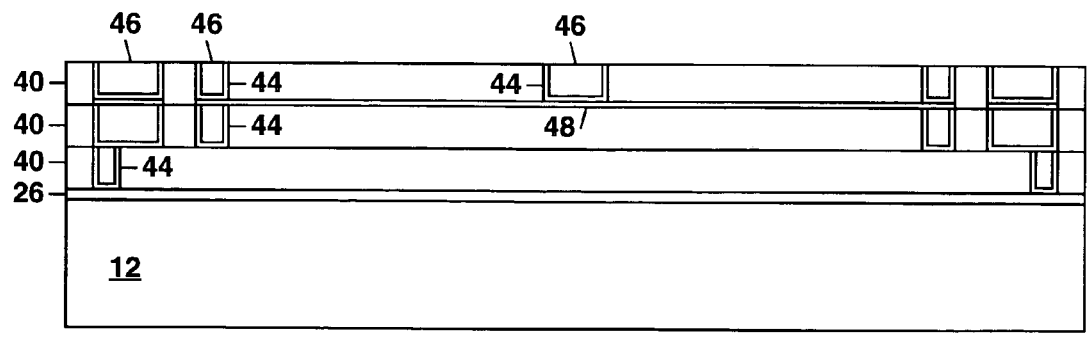

In FIG. 5I the steps of FIGS. 5C–5E can be repeated again to deposit an additional layer of PETEOS 40, and additional layers of titanium nitride 44 and tungsten 46 to further build up the structure of the MEM apparatus 10.

Figure 5J:
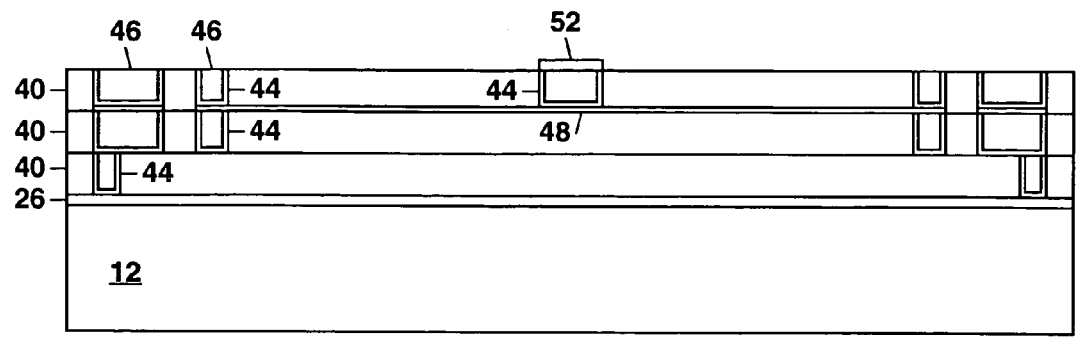

In FIG. 5J, a spacer layer 52 can be blanket deposited over the substrate 12 and patterned by reactive ion etching. The spacer layer 52 can comprise up to about 0.3 μm of tungsten, or alternately 0.3–0.8 μm of low-stress PECVD silicon nitride which can be deposited at a temperature of 350–400° C.

Figure 5K:
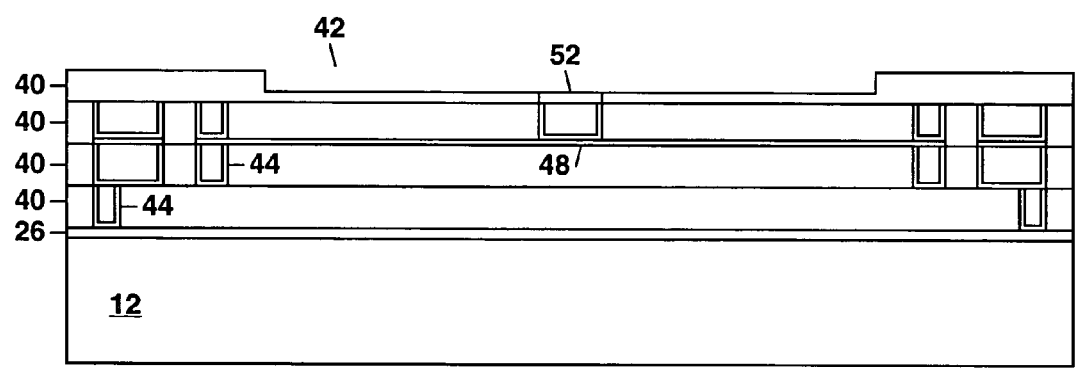

In FIG. 5K, another PETEOS layer 40 can be blanket deposited over the substrate 12 to a layer thickness of about 2 μm, and can then be planarized by chemical-mechanical polishing. An opening 42 can be etched into the PETEOS layer 40 where the stage 18 will be formed.

Figure 5L:
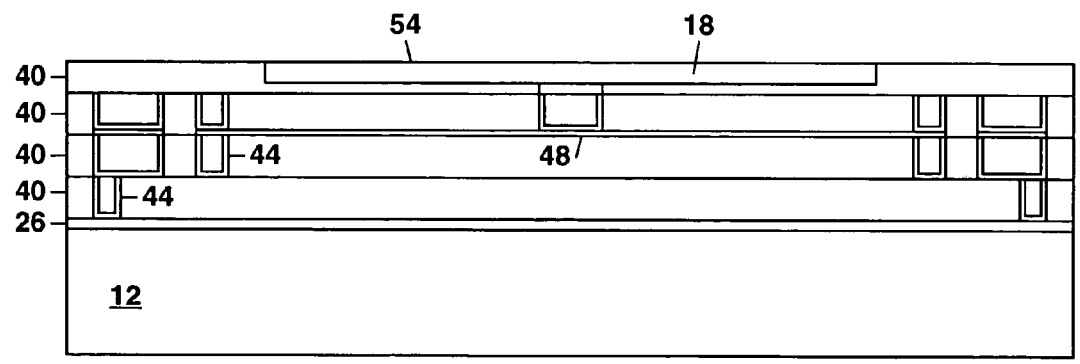

In FIG. 5L, the stage 18 can be formed by blanket depositing polysilicon or aluminum over the substrate 12 to a layer thickness of, for example, 1 μm. The polysilicon or aluminum outside the opening 42 can be removed by chemical-mechanical polishing which also serves to polish a top surface of the stage 18 to provide a light-reflecting surface 54. When the stage 18 comprises polysilicon, a mirror coating can be optionally formed on the top surface by depositing an additional layer of a light-reflecting material such as aluminum or gold.

Figure 6:
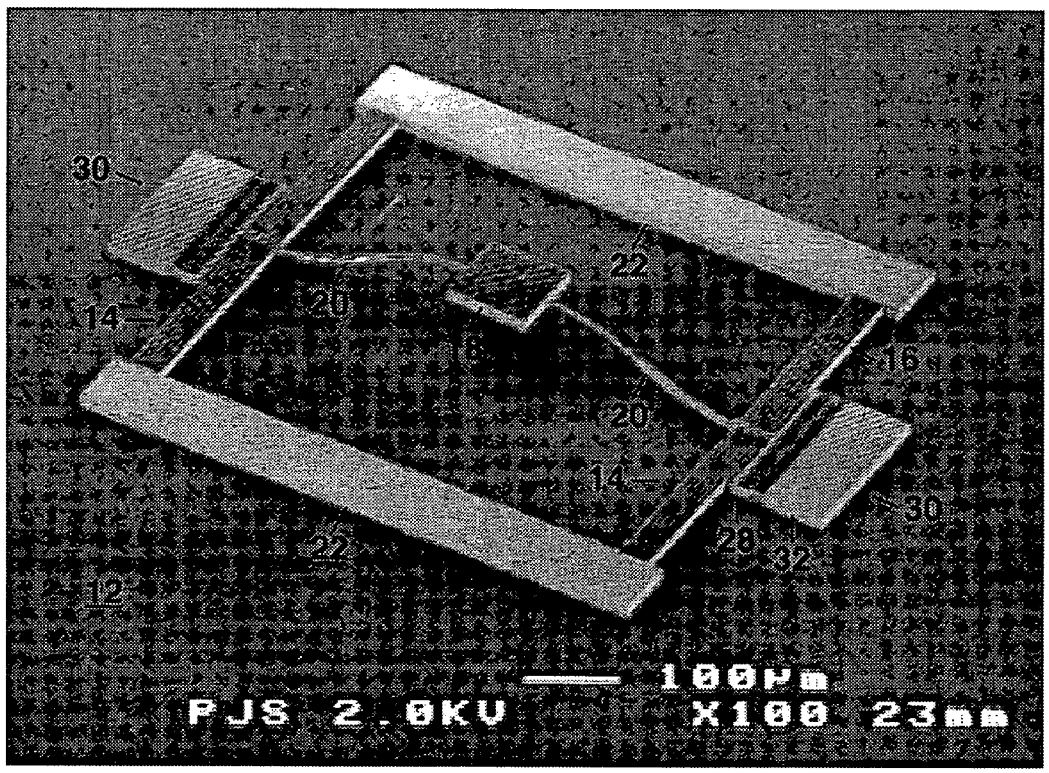
FIG. 6 shows an image of a third example of the MEM apparatus of the present invention after fabrication, and with the stage being raised by action of the tensile-stressed actuators.
Figure 8:
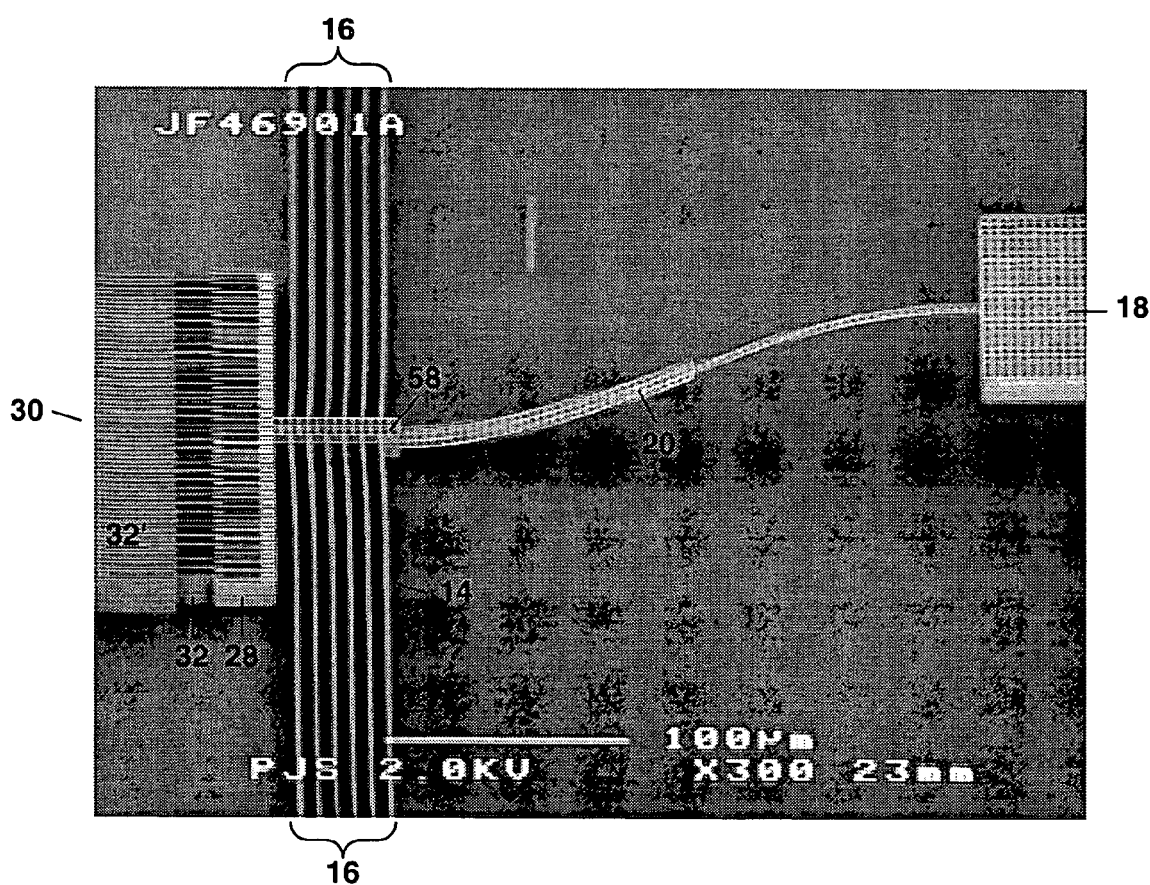
FIG. 8 shows another enlarged image of the MEM device of FIG. 6 to show details of the flexure, stage, tensile-stressed actuator and electrostatic comb actuator.

In other embodiments of the present invention, the stage 18 can comprise tungsten with a mesh structure (see FIGS. 6 and 8). When the stage 18 comprises tungsten with a mesh structure, a layer of titanium nitride can be used beneath the tungsten to promote adhesion of the tungsten as previously described with reference to FIG. 5C. A plurality of openings in the mesh structure of the stage 18 can be filled in with either low-stress silicon nitride or polysilicon; and the stage 18 can be overcoated with a layer of a light-reflecting material such as aluminum or gold.

Once the structure of the MEM apparatus 10 has been built up as shown in FIG. 5L, the various layers of PETEOS 40 can be etched away by immersing the substrate 12 into a selective wet etchant comprising hydrofluoric acid (HF) which does not substantially chemically attack the various layers of titanium nitride 44 and tungsten 46, the substrate 12 or any elements of the MEM apparatus 10 which may be made of silicon nitride or polysilicon. This releases the MEM apparatus 10 so that the stage 18 can be automatically raised by action of the tensile-stress actuator 14 (see FIG. 6).

In the released MEM apparatus 10, the tensile stress in the various elements comprising tungsten 46 including the beams 16 arises primarily from a difference in the coefficient of thermal expansion of the tungsten (about $4.5 \times 10^{-6}$ °C.$^{-1}$) and the silicon substrate 12 (about $3 \times 10^{-6}$ °C.$^{-1}$) as the substrate 12 cools down from the tungsten deposition temperature of about 400° C. to room temperature. In elements of the apparatus 10 which are free to move, this tensile stress can be relaxed in one or more directions. In other elements such as the beams 16 of the tensile-stressed actuator 14, which are pinned to the substrate 12 by the anchors 22, there can be a relatively large tensile stress on the order of 1 GigaPascal (GPa) which remains.

This large built-in tensile stress in the tungsten generally prevents the blanket deposition of a relatively thick ($\geq 1$ μm) tungsten layer and patterning of the tungsten layer by subtractive etching since the blanket deposition of a tungsten layer this thick can have a lateral stress sufficiently large to bow the silicon substrate 12 to an extent that would prevent further processing. Therefore, a damascene process as described in FIGS. 5A–5L can be used to provide stress compensation during fabrication of the MEM apparatus 10.

This damascene process also allows the fabrication of relatively large plates formed from tungsten for certain elements of the MEM apparatus 10 including the stage 18, flexure 20 and anchors 22. These elements can be formed with a mesh structure of arbitrary size and shape, and with the mesh structure being either filled with the PETEOS 40 during fabrication of the MEM apparatus 10, and with the PETEOS 40 later being removed to complete the MEM apparatus 10. In some instances, the mesh structure can be filled with another material such as low-stress silicon nitride or polysilicon which can be left in place in the completed device.

The mesh structure can be produced by utilizing a plurality of spaced-apart trenches (i.e. openings 42) intersecting at 90° in the sacrificial material 40 which can then be filed with titanium nitride 44 and tungsten 46 as previously described with reference to FIGS. 5C–5E. This process can be repeated multiple times as needed to build up the mesh structure. A third example of a MEM device 10 according to the present invention is shown in FIGS. 6–8 to illustrate this mesh structure which can be used for the stage 18 and other elements of the MEM device 10. FIG. 6 shows an image of this third example of the MEM apparatus 10 after fabrication is complete and the stage 18 is raised by action of a pair of tensile-stressed actuators 14 located on both sides of the stage 18.

FIG. 7 shows an enlarged image of the device 10 of FIG. 6 to illustrate fabrication of the flexure 20 with a mesh structure comprising a plurality of cross-members 56 spaced apart by about 2 μm and intersecting at right angles. In this example of the present invention, the flexures 20 have a stepped structure with a width of 6 μm near the tensile-stressed beams 16, and a width of 3 μm near the stage 18 (see FIG. 8). The flexure 20 has an overall thickness of 125 nanometers (nm), and consists of a 100-nm-thick tungsten layer overlying a 25-nm-thick titanium nitride layer. The tensile-stress in the tungsten layer and the compressive stress in the titanium nitride layer provide an upward directed force that aids the tensile-stressed actuators 14 in raising the stage 18 above the substrate 12 upon release of the MEM apparatus 10 by removing the PETEOS 40.

In the MEM device 10 of FIGS. 6–8, a plurality of tensile-stressed beams 16 are ganged together as a set to form the tensile-stressed actuator 14. This scales up the force provided by the tensile-stressed actuator 14 compared to the use of a single tensile-stressed beam as shown in FIG. 1 or a pair of tensile-stressed beams 16 as shown in FIG. 3A. Additionally, a plurality of tungsten layers 46, each about 2 μm thick, are stacked up and interconnected to form the tensile-stressed actuators 14, the stage 18 and the electrostatic comb actuators 30. This can be clearly seen in FIG. 7 which shows the tensile-stressed beams 16 connected to a central member 58 which, in turn, is connected to the flexure 20 on one side and to the moveable electrostatic comb 28 on the other side.

The tensile-stressed beams 16 can be viewed either as straight beams located on either side of the central member 58, or alternately as bent beams which extend through the central member 58 between the two anchors 22. In either case, the operation of the tensile-stressed actuator 14 is the same, with a longitudinally-directed tensile stress in the beams 16 generating a force that uplifts the stage 18 off the substrate 12 as shown in FIGS. 6 and 8 once the surrounding PETEOS 40 has been removed. The tensile-stressed actuator 14 in this example of the present invention has an overall length of 500 μm, with each beam 16 being about 8 μm high and 1.2 μm wide.

In FIG. 8, the stage 18 can also be seen to have a mesh structure. In this example of the present invention, the stage 18 is 100 μm square, and the flexures 20 each have a length of 125 μm. The anchors 22, which extend along the distance between the two tensile-stressed actuators 14 as shown in FIG. 6, also serve as contact pads for simultaneously applying a voltage to each actuator 14 to vary the height of the stage 18 above the substrate 12.

The stationary electrostatic combs 32 also include a support portion 32' wherefrom the comb fingers are cantilevered outward, with the support portion 32' being used as a contact pad for one side of the electrostatic comb actuator 30. To activate the electrostatic comb actuator 30, a voltage of up to 200 volts can be applied between the support portion 32' and one of the anchors 22 which is connected to the moveable electrostatic comb 28 through the tensile-stressed beams 16 and central member 58. The amount of force produced by the electrostatic comb actuator 30 will, in general, depend upon the exact voltage applied. The electrically insulating layer 26 electrically isolates the anchors 22 and support portions 32' from the substrate 12.

The various examples of the MEM apparatus 10 of the present invention described herein can also be fabricated using silicon nitride as the tensile-stressed material. The tensile-stressed silicon nitride can be formed by thermal CVD (i.e. CVD without a plasma) at a relatively high deposition temperature of about 800° C. and with a generally stoichiometric composition (i.e. $Si_3N_4$). When this is done, the tensile stress in the silicon nitride arises during cooling down to room temperature since the thermal expansion coefficient for silicon nitride (about $4\times10^{-6}$° $C.^{-1}$) is about one-third larger than that of the silicon substrate 12. There is also built-in stress arising from the deposition process itself.

Since the silicon nitride is not electrically conductive, the tensile-stressed beams 16, anchors 22, electrostatic comb actuator 30, if used, and other elements of the MEM apparatus 10 requiring electrical conductivity can be formed with a composite structure that comprises an electrically-conductive material such as doped polysilicon superposed with the silicon nitride. This is schematically illustrated in FIG. 9 which shows a cross-section view of a tensile-stressed beam 16 comprising an outer portion 60 formed of silicon nitride, and an inner portion 62 comprising the electrically-conductive material.

Figure 9:
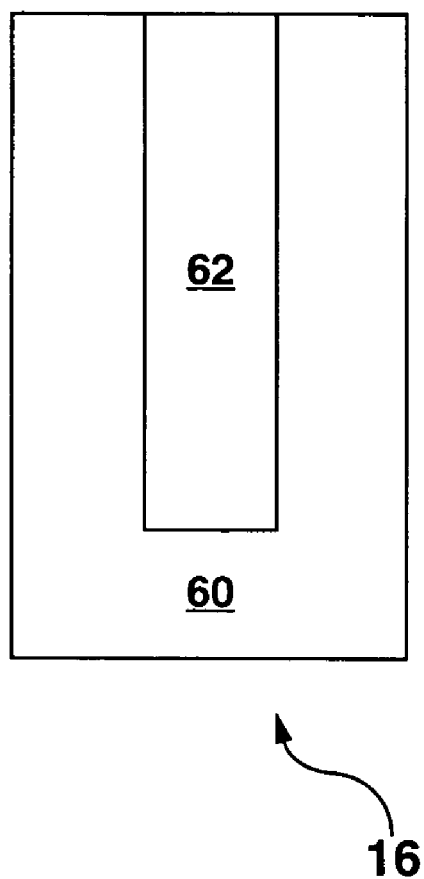
FIG. 9 shows a schematic cross-section view of a tensile-stressed beam formed with an outer portion of tensile-stressed silicon nitride and an inner portion of an electrically-conductive material.

To form the composite structure of FIG. 9 with a width of, for example, 1.2 µm and a depth of 3 µm, about 400 nanometers of silicon nitride can be initially deposited by thermal CVD at about 800° C. to blanket the substrate 12 and to line the openings 42 shown in FIG. 5B. The remaining space in each opening 42 can then be filled with polysilicon which has been doped for electrical conductivity with an impurity dopant such as phosphorous or boron. The polysilicon can be blanket deposited at a temperature of about 580° C. using low pressure chemical vapor deposition (LPCVD) and annealed later to at least 800° C. to activate the impurity dopant. Any of the silicon nitride and polysilicon extending outside the openings 42 can be removed by CMP to complete the portions 60 and 62. This process can be repeated as needed to build up additional layers of the composite structure of the tensile-stressed beams 16 and other elements of the MEM apparatus 10 which must be electrically conductive.

For elements of the MEM apparatus 10 which do not need to be electrically conductive, the openings 42 in FIG. 5B can be completely filled with deposited silicon nitride. This can be done, for example, by making the openings 42 for these elements narrower (e.g. 0.6 µm wide) so that the thermal CVD deposition of silicon nitride completely fills in the openings 42. Then, any subsequently-deposited polysilicon will lie completely outside the narrower openings 42 and will be removed during the CMP step. This allows the use of a single mask to define both the non-conducting elements and the electrically-conducting elements in each layer of the MEM apparatus 10, simply by controlling the opening size for the conducting and non-conducting elements. The non-conducting elements can have a mesh structure as previously described with a plurality of intersecting trenches about 0.6 µm wide.

The use of doped polycrystalline silicon as the electrically-conductive material will increase the resistivity as compared with tungsten. This will allow the use of a lower current and higher voltage for activation of the MEM device 10. The polysilicon in adjacent stacked layers having the composite structure of FIG. 9 can also be electrically connected in parallel or in series. This can be done by etching openings down through each subsequently-deposited silicon nitride outer portion 60 so that when the doped polysilicon inner portion 62 is deposited, it will fill in the openings and to form a series or parallel connection.

Figure 10:
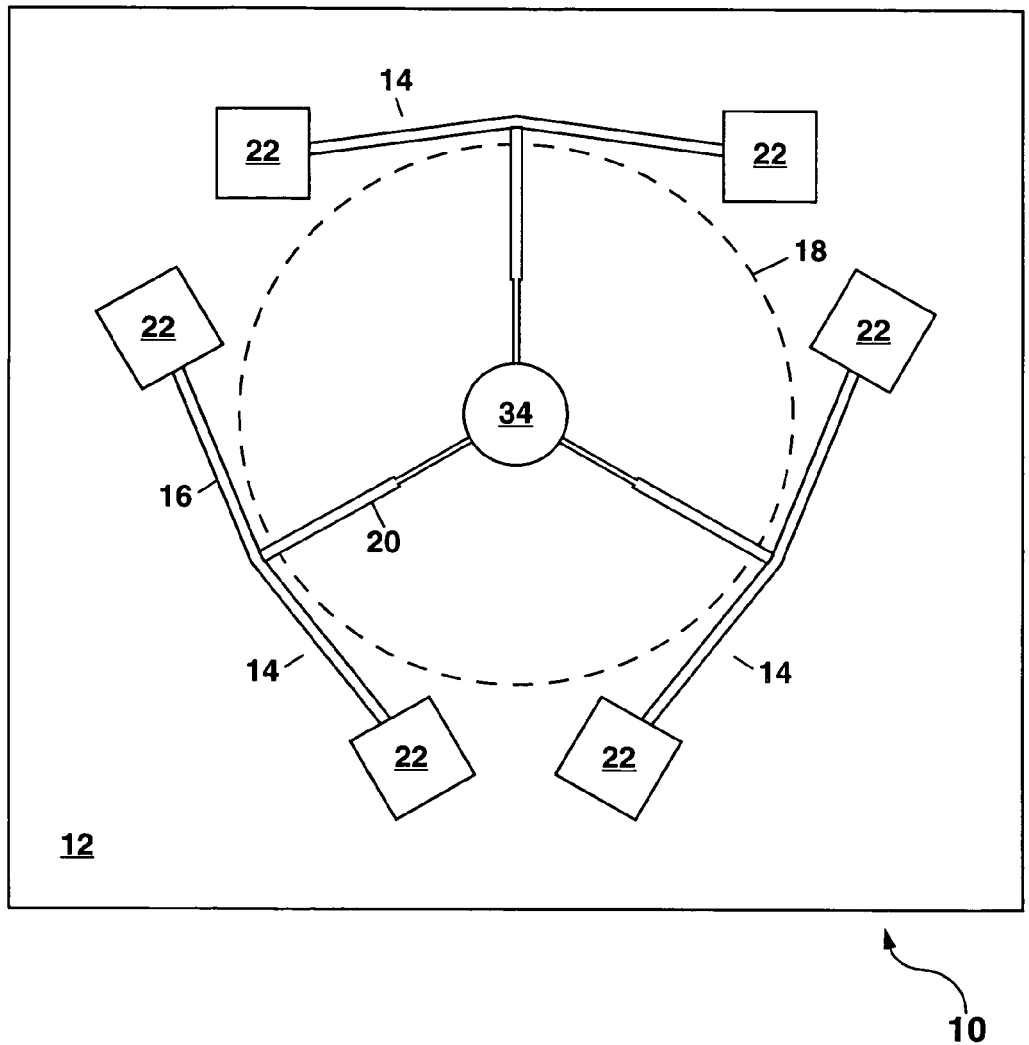
FIG. 10 shows a fourth example of the MEM apparatus of the present invention.

FIG. 10 shows a schematic plan view of a fourth example of the MEM apparatus 10 of the present invention. In FIG. 10, the MEM apparatus 10 is a tiltable micromirror which can be used to redirect incident light (e.g. for optical switching or for use in a projection display). The stage 18 in FIG. 10 has been omitted and replaced with a dashed circle to show the underlying support post 34 to which a plurality of flexures 20 are attached, and to which the stage 18 is also attached. A plurality of tensile-stressed actuators 14 are spaced about the support post 34 and are operatively connected thereto using the flexures 20. The tensile-stressed actuators 14 initially raise the stage 18 as previously described with reference to FIGS. 1 and 3B, and then can be used to control the height and tilt angle of the stage 18 by applying a voltage across the tensile-stressed beams 16 of one or more of the actuators 14 to heat the beams 16 and reduce the tensile stress therein. Tilting the stage 18 in any direction is possible by varying the height at different points around the support post 34 using the tensile-stressed actuators 14. A plurality of tensile-stressed beams 16 can be ganged together and substituted for the single beam 16 shown in FIG. 10 for each tensile-stressed actuator 14. Furthermore, although not shown in FIG. 10, another actuator (e.g. an electrostatic comb actuator or a parallel plate electrostatic actuator) can be coupled to each tensile-stressed actuator 14 in a manner similar to that schematically shown in FIG. 3A. This can allow the stage 18 to be moved and tilted beyond that which is possible using the tensile-stressed actuators 14 alone.

In the example of FIG. 10, each tensile-stressed actuator 14 can comprise tungsten, titanium nitride, silicon nitride, polysilicon, or combinations thereof. The flexures 20 can similarly comprise tungsten, titanium nitride, silicon nitride, polysilicon or combinations thereof. The anchors 22 and support post 34 can be formed with a mesh structure, if needed, to provide lateral stress compensation when fabricating these elements from tensile-stressed materials such as tungsten and silicon nitride. The stage 18 can also comprise polysilicon or aluminum as previously described with reference to FIG. 3B. When polysilicon is used for the stage 18 or when the stage 18 has a mesh structure with openings filled in with polysilicon or low-stress silicon nitride, a light-reflecting coating (e.g. comprising aluminum or gold) can be provided overtop the stage 18 to improve the reflectivity for light.

The various examples of the MEM apparatus 10 of the present invention can, in some instances, be fabricated on a substrate 12 containing complementary metal-oxide-semiconductor (CMOS) integrated circuitry. This can be done by forming the CMOS integrated circuitry first using a series of processes well known in the art. A passivation layer (e.g. comprising PECVD silicon nitride) can be formed over the CMOS integrated circuitry prior to forming the MEM apparatus 10. This passivation layer, which has a low level of stress due to the relatively low PECVD deposition temperature of 350–400° C., can also be used to protect the CMOS integrated circuitry during the selective wet etching step used to remove the sacrificial material and release the MEM apparatus 10 as previously described.

During fabrication of the MEM apparatus 10, electrical vias can be etched down through the passivation layer to form electrical interconnections between the CMOS integrated circuitry and the MEM apparatus 10, as needed. The CMOS integrated circuitry can be used to provide actuation voltages for operation of the tensile-stressed actuators 14 and the electrostatic actuators, if any, in the MEM apparatus 10.

In general, devices 10 fabricated from CVD-deposited tungsten will be compatible with back-end-of-line processing after first fabricating CMOS circuitry on the substrate 12 due to the relatively low deposition temperatures of $\leq 400°$ C. On the other hand, devices 10 formed with a composite thermal CVD silicon nitride and LPCVD polysilicon structure will generally not be back-end-of-line CMOS compatible due to the much higher temperatures for deposition of the LPCVD polysilicon (580° C.) and subsequent annealing thereof ($\geq 800°$ C.), and for deposition of the thermal CVD silicon nitride (800° C.).

Yet other materials can be used to form the tensile-stressed beams 16 in the various examples of the MEM apparatus 10 described herein. As an example, silicon carbide, which can be doped for electrical conductivity, can be substituted for tungsten or the silicon nitride/polysilicon composite structure in forming the tensile-stressed beams 16 and other elements of the MEM apparatus 10.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A microelectromechanical (MEM) apparatus, comprising:
   (a) a substrate;
   (b) a tensile-stressed actuator formed on the substrate and providing movement in a direction which is substantially parallel to the substrate, with the tensile-stressed actuator further comprising a beam suspended above the substrate and having a longitudinally-directed tensile stress therein, and with an unanchored portion of the beam being moveable substantially parallel to the substrate in response to the longitudinally-directed tensile stress therein;
   (c) a stage supported above the substrate by a flexure, with the flexure being operatively connected at one end thereof to the tensile-stressed actuator to raise the stage above the substrate in response to the movement provided by the tensile-stressed actuator.

2. The MEM apparatus of claim 1 further comprising means for changing a position of the stage after the stage has been raised above the substrate in response to the movement provided by the tensile-stressed actuator.

3. The MEM apparatus of claim 2 wherein the means for changing the position of the stage comprises a voltage applied across the beam to resistively heat the beam, and thereby reduce the longitudinally-directed tensile stress therein.

4. The MEM apparatus of claim 2 wherein the means for changing the position of the stage comprises an electrostatic actuator operatively connected to the tensile-stressed actuator to change the movement provided by the tensile-stressed actuator.

5. The MEM apparatus of claim 1 wherein the substrate comprises silicon.

6. The MEM apparatus of claim 1 wherein the beam comprises tungsten.

7. The MEM apparatus of claim 6 wherein the beam further comprises titanium nitride.

8. The MEM apparatus of claim 6 wherein the flexure comprises tungsten.

9. The MEM apparatus of claim 8 wherein the flexure further comprises titanium nitride.

10. The MEM apparatus of claim 6 wherein the flexure comprises an mesh structure.

11. The MEM apparatus of claim 1 wherein the stage comprises a metal.

12. The MEM apparatus of claim 1 wherein the stage comprises a light-reflecting surface.

13. The MEM apparatus of claim 1 wherein each beam comprises silicon nitride.

14. The MEM apparatus of claim 13 wherein each beam further comprises an electrically-conductive material.

15. A microelectromechanical (MEM) apparatus, comprising:
   (a) a substrate;
   (b) a stage suspended above the substrate by at least one flexure, with each flexure being connected between the stage and a set of tensile-stressed beams having a tensile stress directed longitudinally within each beam therein, and with the longitudinally-directed tensile stress generating a movement in a direction substantially parallel to the substrate to bend the flexure and thereby raise the stage above the substrate; and
   (c) means, operatively connected to the stage, for changing the position of the stage above the substrate.

16. The MEM apparatus of claim 15 wherein each beam comprises tungsten.

17. The MEM apparatus of claim 16 wherein each flexure comprises tungsten.

18. The MEM apparatus of claim 15 wherein the set of tensile-stressed beams comprises a single beam.

19. The MEM apparatus of claim 15 wherein the set of tensile-stressed beams comprises a plurality of beams.

20. The MEM apparatus of claim 15 wherein the stage comprises a light-reflecting surface.

21. The MEM apparatus of claim 15 wherein the means for changing the position of the stage above the substrate comprises a voltage applied to resistively heat the set of tensile-stressed beams and thereby reduce the longitudinally-directed tensile-stress therein.

22. The MEM apparatus of claim 15 wherein the means for changing the position of the stage above the substrate comprises an electrostatic actuator operatively connected to the stage.

23. The MEM apparatus of claim 15 wherein the means for changing the position of the stage above the substrate lowers or raises the stage without tilting the stage.

24. The MEM apparatus of claim 15 wherein the means for changing the position of the stage above the substrate tilts the stage.

* * * * *